United States Patent [19]

Fujita et al.

[11] 3,792,377

[45] Feb. 12, 1974

[54] TEMPERATURE COMPENSATED QUARTZ OSCILLATOR CIRCUIT

[75] Inventors: Kinji Fujita; Hiromitsu Mitsui, both of Takagi, Japan

[73] Assignee: Kabushiki Kaisha Suwa Seikasha, Tokyo, Japan

[22] Filed: Dec. 27, 1971

[21] Appl. No.: 212,269

[30] Foreign Application Priority Data

Dec. 28, 1970 Japan ............................ 45/120055

[52] U.S. Cl. ............ 331/116 R, 58/23 A, 317/247, 331/108 D, 331/163, 331/176

[51] Int. Cl. ............................................ H03b 5/36

[58] Field of Search.... 331/116 R, 163, 176, 108 D; 330/35; 307/304; 58/23 A, 23 AC; 317/247, 248

[56] References Cited

UNITED STATES PATENTS 3,210,607 10/1965 Flanagan ......................... 317/248 X
3,568,093 3/1971 Ishida et al ...................... 331/116 R
3,585,527 6/1971 Luscher ............................ 331/116 R
3,664,118 5/1972 Walton ............................ 331/116 R X

FOREIGN PATENTS OR APPLICATIONS

44/5648 3/1966 Japan .................................. 331/116

OTHER PUBLICATIONS

Scott, "Getting to Know Low-Cost IC's," Radio-Electronics, March 1967, pp. 44–46.

*Primary Examiner*—Herman Karl Saalbach
*Assistant Examiner*—Siegfried H. Grimm
*Attorney, Agent, or Firm*—Blum, Moscovitz, Friedman & Kaplan

[57] ABSTRACT

A quartz oscillator having a four-terminal quartz vibrator, two of the four terminals being connected with a compensating device for compensating the temperature coefficient of the quartz vibrator frequency, the other two terminals being connected with an active circuit including at least one MOS transistor.

4 Claims, 3 Drawing Figures

TEMPERATURE COMPENSATED QUARTZ OSCILLATOR CIRCUIT

BACKGROUND OF THE INVENTION

This invention relates to quartz oscillation circuits. In the art, such quartz oscillation circuits have been formed including quartz vibrators, but said quartz vibrators reauire temperature compensation in order to maintain the frequency output thereof at a constant level in the face of temperature variations. In the prior art arrangements, such temperature compensating arrangements have consumed substantial energy. Further, conventional quartz oscillation circuits have included bipolar transistors which have, because of the characteristics thereof, required coupling condensers of relatively large value. Such coupling condensers, because of the size thereof, could not be incorporated in an integrated circuit, and accordingly, resulted in an increase in the cost and size of the circuit.

SUMMARY OF THE INVENTION

Generally speaking, in accordance with the invention, a quartz oscillator is provided including a quartz vibrator having four terminals, means for compensating the temperature coefficient of said quartz vibrator frequency coupled to two of said four terminals, and active circuit means including at least one MOS transistor coupled to the other two of said terminals. The temperature compensating means may include a condenser such as a ceramic condenser incorporating an electrolite formed from $TiO_2BaO$, the capacitance of which changes in response to temperature. Said four-terminal quartz vibrator may be oscillated by means of an active circuit including only a single MOS transistor.

Accordingly, one object of the arrangement according to the invention is to provide an oscillation circuit which includes means for compensating the temperature coefficient of the quartz vibrator without requiring energy for compensating an active element in the oscillation circuit having a large input impedance.

Still another object of the invention is to provide an oscillation circuit which is readily integrated, and utilizing MOS transistors in the active circuit, while providing means for compensating the characteristic oscillation frequency and temperature coefficient of said quartz vibrator.

Still other objects and advantages of the invention will in part be obvious and will in part be apparent from the specification and drawings.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
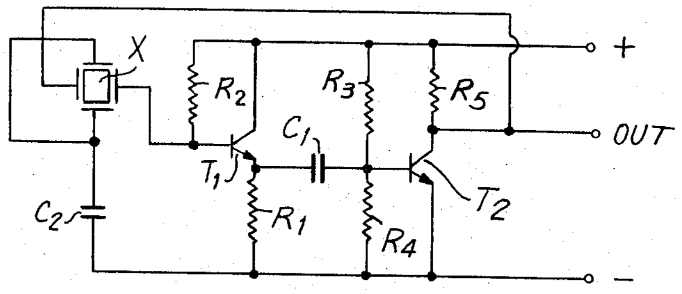
FIG. 1 PRIOR ART
FIG. 1 is a circuit diagram of a conventional oscillation circuit for a four-terminal quartz vibrator.

Referring not to FIG. 1, the prior art oscillation circuit depicted incorporates a four-terminal quartz vibrator X driven by two bipolar transitors $T_1$ and $T_2$. The circuit includes resistors $R_1$, Rhd 2, $R_3$, $R_4$, and $R_5$, as well as a coupling condenser $C_1$. A further condenser $C_2$ is connected in series with quartz vibrator X. Condenser $C_2$ serves as a frequency adjustor means for said quartz vibrator and is separate from the active circuit including transistors $T_1$ and $T_2$.

The resistors and active elements such as transistors $T_1$ and $T_2$ of the circuit of FIG. 1 can be integrated, but the coupling condenser $C_1$ must be of a large capacitance value, and therefore must occupy a large volume of space. For example, if the oscillating frequency is about 8kHz, condenser $C_1$ must have a value of about 1 nanofarad, defining a condenser which is difficult to provide in a small space. The input impedance of the bipolar NPN transistor $T_2$ between the base and emitter electrodes of the common emitter amplifier circuit is particularly small when the input signal is positive, so as to be unable, by itself, to drive the oscillation of the quartz vibrator. For this reason, the oscillation circuit of FIG. 1 is provided with an emitter follower circuit incorporating transistor $T_2$. Coupling condenser $C_1$ is required to couple the base electrode of transistor $T_2$. The capacitance of condenser $C_1$ can range from about 1,000 picofarads to about 5,000 picofarads where a low frequency quartz vibrator is used, such as the 8,192 Hz or 16,384 Hz vibrators usually incorporated in conventional quartz vibrator wristwatches.

Figure 2:
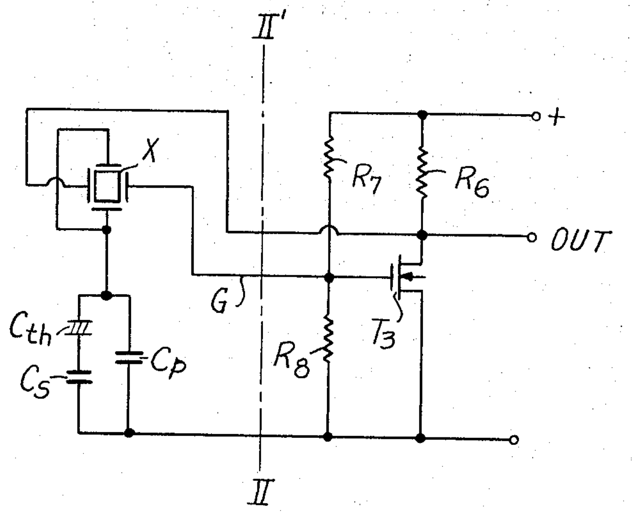
FIGS. 2 and 3 are circuit diagrams of two embodiments of the quartz oscillation circuit in accordance with the invention.

Referring now to FIGS. 2, an oscillation circuit according to the invention is depicted incorporating a minimum number of resistor s and transistors, and not requiring a condenser having a large value of capacitance. The active circuit portion of the oscillation circuit of FIG. 2 incorporates only a single N-channel type MOS (metal oxide semiconductor) transistor $T_3$. A condenser $C_{th}$ for compensating the temperature coefficient of four-terminal quartz vibrator X is connected in series with a condenser $C_s$, said series connection being connectd in parallel with condenser $C_p$. Condensers $C_s$ and $C_p$ are provided for adjusting the frequency of oscillation, and the combination of capacitors $C_{th}$, $C_s$ and $C_p$ is connected in series with said quartz vibrator. The portion of the oscillating circuit of FIG. 2 to the left of phantom line II – II' constitutes a quartz vibrator unit and its compensating and adjusting means. The portion of said circuit to the right of said phantom line defines an oscillation circuit for the four-terminal quartz vibrator. The latter oscillation or active circuit is particularly adapted for integration. While the embodiment depicted in the drawings incorporates a MOS transistor, a MIS-type transistor provided with an insulator layer between its metallic gate and substrate is equally applicable to the arrangement according to the invention. Both of these types of transistors are field effect, as opposed to the junction type transistors of the embodiment of FIG. 1.

Figure 3:
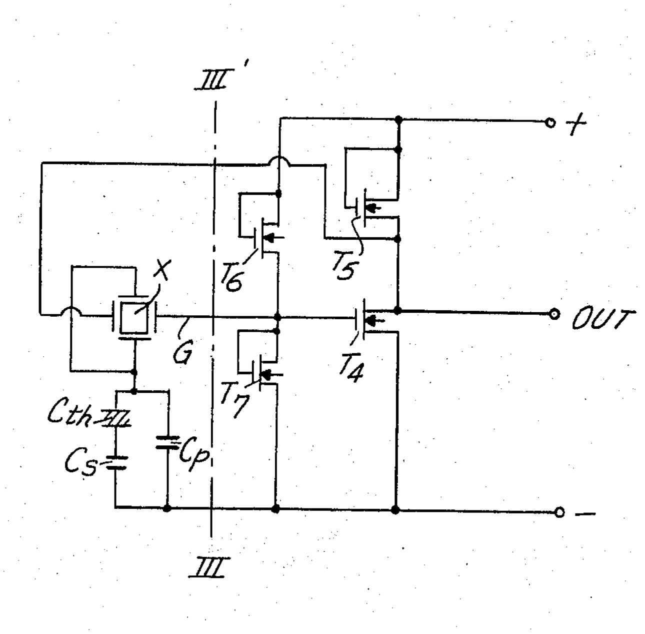

A second embodiment of the oscillation circuit according to the invention is depicted in FIG. 3. In said embodiment, the resistors of the embodiment of FIG. 2 were replaced by MOS trasistors $T_5$,$T_6$and $T_7$, which are readily integrated. MOS transistor $T_4$ is the active oscillation element, the portion of the circuit to the left of phantom line III – III' being a quartz vibrator unit, while the portion to the right of said line constituting q wholly integrated active circuit.

The detecting terminal G of the quartz vibrator of the embodiment of FIGS. 2 and 3 is connected to the gate electrode of transistors $T_3$ and $T_4$ respectively. Since these transistors are of the insulated gate field effect type, the input impedance thereof is very high in comparison with that of the bipolar junction type transitors of the embodiment of FIG. 1. For this reason, the arrangement of FIGS. 2 and 3 does not require the emitter follower circuit required in FIG. 1.

The quartz crystal oscillation circuit in accordance with the invention consumes only about 1 microwatt of power, the means for compensating the temperature coefficient of quartz frequency requiring no energy. Further, the arrangement differs from the conventional quartz oscillator in that it does not require a heating box and does not consume very much energy. For this reason, the oscillator is particularly adapted for application to wristwatches where a minimum amount of energy and space is available.

It will thus be seen that the objects set forth above, and those made apparent from the preceding description, are efficiently attained and, since certain changes may be made in the above constructions without departing from the spirit and scope of the invention, it is intended that all matter contained in the above decription or shown in the accompanying drawings shall be interpreted as illustrative and not in a limiting sense. It is also to be understood that the following claims are intended to cover all of the generic and specific features of the invention herein described, and all statemens of the scope of the invention which, as a matter of language, might be said to fall therebetween.

What is claimed is:

1. A quartz oscillator for electronic wrist watches comprising a four-terminal quartz vibrator; condenser means for compensating the temperature coefficient of said quartz vibrator frequency connected to a first and second of said four terminals of said quartz vibrator having a temperature sensitive electrolyte formed from $TiO_2BaO$ ferro-electric material such that the capacitance of said condenser means varies with temperature; frequency adjusting means including a first condenser means connected in series with said temperature compensating condenser means and a second condenser means connected in parallel with the series connection of said temperature compensating condenser means and said first condenser means and in series with said first and second terminals of said quartz vibrator; an active oscillation circuit including at least one MOS insulated gate field effect type transistor means, a third of said four terminals being connected to the gate electrode of said transistor means, the fourth of said terminals being connected to the source-drain path of said transistor means to define the output of said quartz oscillator.

2. A quartz oscillator as recited in claim 1, wherein said active circuit includes a voltage source, first resistor means connected in series with the source-drain path of said transistor means across said voltage source; second and third resistor means connected in series with each other, said series connection being connected across said source of voltage, the gate electrode of said transistor means being conected to the junction between said second and third resistor means, said fourth terminal being connected to the junction between said first resistor means and said transistor means.

3. A quartz oscillator as recited in claim 1, wherein said active circuit includes a voltage source; second field effect transistor means having its source-drain path connected in series with the source-drain path of said first-mentioned transistor means, the series connection of said first and second transistor means being connected across said voltage source; and third and fourth field effect transistor means having their respective source-drain paths connected in seies, said series connected third and fourth transistor means being connected across said voltage source, each of said second, third and fourth transistor means having its respective gate electrode connected to its respective source-drain path, the gate electrode of said first-mentioned transistor means being connected to the junction between the source-drain paths of said third and fourth transistor means, said fourth terminal of said quartz vibrator being connected to the junction between the source-drain paths of said first-mentioned and second transistor means to define the output of said quartz oscillator.

4. A quartz oscillator as recited in claim 1, wherein said field effect transistor means is of the N-channel MOS type.

* * * * *